United States Patent
Kim

(10) Patent No.: US 11,367,612 B2
(45) Date of Patent: Jun. 21, 2022

(54) METHOD AND APPARATUS FOR MANUFACTURING SEMICONDUCTOR MANUFACTURING PARTS BY USING JIG

(71) Applicant: TOKAI CARBON KOREA CO., LTD, Anseong-si (KR)

(72) Inventor: Ki Won Kim, Anseong-si (KR)

(73) Assignee: Tokai Carbon Korea Co., LTD, Anseong-si (KR)

( * ) Notice: Subject to any disclaimer, the term of this patent is extended or adjusted under 35 U.S.C. 154(b) by 236 days.

(21) Appl. No.: 16/466,271

(22) PCT Filed: Dec. 18, 2017

(86) PCT No.: PCT/KR2017/014906
§ 371 (c)(1),
(2) Date: Jun. 3, 2019

(87) PCT Pub. No.: WO2018/117558
PCT Pub. Date: Jun. 28, 2018

(65) Prior Publication Data
US 2020/0111661 A1    Apr. 9, 2020

(30) Foreign Application Priority Data

Dec. 20, 2016  (KR) .................. 10-2016-0174906
Dec. 12, 2017  (KR) .................. 10-2017-0170790

(51) Int. Cl.
*H01L 21/02* (2006.01)
*C23C 16/455* (2006.01)
*C23C 16/458* (2006.01)

(52) U.S. Cl.
CPC ........ *H01L 21/0228* (2013.01); *C23C 16/458* (2013.01); *C23C 16/45544* (2013.01)

(58) Field of Classification Search
CPC .......... H01L 21/0228; H01L 21/68757; C23C 16/45544; C23C 16/458
See application file for complete search history.

(56) References Cited

U.S. PATENT DOCUMENTS 4,684,113 A * 8/1987 Douglas ................. B23Q 1/035
                                                         269/21
5,338,363 A * 8/1994 Kawata ............. C23C 16/45512
                                                         118/715

(Continued)

FOREIGN PATENT DOCUMENTS

JP     11-258086     9/1999
JP     2000178743    6/2000

(Continued)

OTHER PUBLICATIONS

Machine translation, JP-2016169422 (Year: 2016).*
International Search Report dated Mar. 26, 2018 for PCT application No. PCT/KR2017/014906 and translation, 5 pages.

*Primary Examiner* — Michael B Cleveland
*Assistant Examiner* — Michael G Miller
(74) *Attorney, Agent, or Firm* — Evan Law Group LLC

(57) ABSTRACT

The present invention relates to a method for manufacturing semiconductor manufacturing parts used in a dry etching process, and a jig usable therein, and the method for manufacturing semiconductor manufacturing parts by using the jig, of the present invention, comprises the steps of: preparing a base material; supporting at least one surface of the base material by the jig; forming a deposition layer by spraying source gas on the base material supported by the jig; and processing the base material on which the deposition layer is formed, wherein the jig has a tapered cross-section of which the width increases in the direction of approaching the surface of the base material.

7 Claims, 2 Drawing Sheets

(56) References Cited

U.S. PATENT DOCUMENTS

| | | | |
|---|---|---|---|
| 5,576,058 A | 11/1996 | Norrgrann et al. | |
| 2007/0077355 A1* | 4/2007 | Chacin | C23C 16/52 |
| | | | 427/248.1 |
| 2015/0321966 A1* | 11/2015 | Shinohara | C04B 41/89 |
| | | | 428/172 |

FOREIGN PATENT DOCUMENTS

| | | | |
|---|---|---|---|
| JP | 2007273623 | | 10/2007 |
| JP | 2016-169422 | | 9/2016 |
| JP | 2016169422 A | * | 9/2016 |
| JP | 2019-532782 | | 7/2020 |
| KR | 10-2010-0095285 | | 8/2010 |
| KR | 10-2012-0102548 | | 9/2012 |
| KR | 10-2012-0125311 | | 11/2012 |
| KR | 10-2014-0111997 | | 9/2014 |
| KR | 10-2016-0007559 | | 1/2016 |

* cited by examiner

US 11,367,612 B2
1

METHOD AND APPARATUS FOR MANUFACTURING SEMICONDUCTOR MANUFACTURING PARTS BY USING JIG

TECHNICAL FIELD

Example embodiments relate to a method for manufacturing a semiconductor manufacturing parts used in a dry etching process and a jig available therein.

BACKGROUND ART

In general, a plasma processing method used in a semiconductor manufacturing process is one of dry etching processes through which a target is etched using gas. This method may include injecting etching gas into a reaction vessel and ionizing it, accelerating it to a wafer surface, and physically and chemically removing the wafer surface. The method is widely used because it is easy to control etching and is highly productive, and enables a formation of a fine pattern of tens of nanometers (nm).

Various semiconductor manufacturing parts including a focus ring in a dry etching device may be used to allow plasma to be concentrated around a wafer on which an etching process is performed in a reaction vessel under an unfavorable condition in the presence of plasma. Herein, such a part itself may be exposed to plasma and thus damaged. Thus, researches have been continuously conducted to increase plasma resistance of a semiconductor manufacturing part. As one of such researches, research on a method of forming a deposition layer formed of a SiC material instead of using a Si material on a part, such as a focus ring or an electrode of a semiconductor, has been conducted.

Here, technology for forming a deposition layer on a base material may play an important role in determining quality of a semiconductor manufacturing part. In the related art, various types of decomposition techniques have been studied to form a deposition layer on a base material and to prevent the deposition layer from ununiformly being formed.

In the related art, deposition is performed over the whole surface in a state in which a material to be deposited or a base material is supported by a jig in a deposition chamber. Accordingly, uniformity of the deposition layer formed on the surface of the base material supported by the jig may be degraded. In particular, when the jig is in an angular shape or in a convex shape, a deposition material may not be uniformly deposited around the base material supported by the jig (occurrence of a deposition-free portion).

DISCLOSURE OF INVENTION

Technical Goals

Example embodiments provide a method capable of outperforming nonuniformity of a deposition layer that is likely to occur in response to using a jig during a process of forming the deposition layer by applying chemical vapor deposition (CVD) to a semiconductor manufacturing part. In the case of forming the deposition layer using the jig disclosed herein, deposition uniformity of the formed deposition layer may increase, thereby enhancing quality of the deposition layer of a product.

However, the example embodiments are not limited to what is described above, and it is thus obvious to those skilled in the art that other tasks not described herein may also be achieved from the example embodiments to be described hereinafter.

Technical Solutions

According to the present disclosure, there is provided a method of manufacturing a semiconductor manufacturing part using a jig, the method including preparing a base material; supporting at least one surface of the base material using the jig; forming a deposition layer by injecting source gas into the base material supported by the jig; and processing the base material on which the deposition layer is formed. The jig has a cross-section in a tapered shape and of which a width increases with getting closer to the surface of the base material.

According to an example embodiment, in a contact portion between the jig and the base material, an angle between the jig and the base material of the contact portion may be an obtuse angle.

According to an example embodiment, the angle between the jig and the base material of the contact portion may be 95 degrees to 170 degrees.

According to an example embodiment, the jig may include at least one of graphite, carbon black, and SiC.

According to an example embodiment, the processing may include performing a cutting process to include the deposition layer configured to include at least a portion of the base material and to cover at least a portion of the jig.

According to an example embodiment, the base material may include at least one of graphite, TaC, reaction sintered SiC, pressureless sintered SiC, hot press SiC, recrystallized SiC, and CVD SiC.

According to an example embodiment, a thickness ratio of the base material to the deposition layer may be 1:1 to 100:1.

According to the present disclosure, there is provided a method of manufacturing a semiconductor manufacturing part using a jig, the method including preparing a base material; supporting at least one surface of the base material using the jig; forming a deposition layer by injecting source gas into the base material supported by the jig; and processing the base material on which the deposition layer is formed. At least one side of a cross-section of the jig that connects to a contact surface with the base material is rounded.

According to the present disclosure, there is provided an apparatus for manufacturing a semiconductor manufacturing part using a jig, the apparatus including a chamber; a source gas injecting nozzle provided inward at an outside of the chamber; a mounting portion configured to extend from at least one side of the chamber toward an inner center of the chamber; and a replaceable jig configured to support a base material that is connected at one end of the mounting portion. The jig has a cross-section in a tapered shape and of which a width increases with getting closer to the surface of the base material.

According to an example embodiment, in a contact portion between the jig and the base material, an angle between the jig and the base material of the contact portion may be an obtuse angle.

According to an example embodiment, the angle between the jig and the base material of the contact portion may be 95 degrees to 170 degrees.

According to the present disclosure, there is provided an apparatus for manufacturing a semiconductor manufacturing part using a jig, the apparatus including a chamber; a source gas injecting nozzle provided inward at an outside of the chamber; a mounting portion configured to extend from at least one side of the chamber toward an inner center of the chamber; and a replaceable jig configured to support a base material that is connected at one end of the mounting portion. At least one side of a cross-section of the jig is concavely rounded.

According to the present disclosure, there is provided a jig for manufacturing a semiconductor manufacturing part, wherein the jig is configured to support a base material, and has a cross-section in a tapered shape and of which a width increases with getting closer to the surface of the base material.

According to the present disclosure, there is provided a jig for manufacturing a semiconductor manufacturing part, wherein the jig is configured to support a base material, and at least one side of a cross-section of the jig that connects to a contact surface with the base material is rounded.

Advantageous Effects

In the case of using a manufacturing method or a jig according to example embodiments, it is possible to form a homogenous deposition layer including a contact portion between a jig and a coated material or a base material without a deposition-free surface when manufacturing a semiconductor manufacturing part using a deposition method, such as chemical vapor deposition (CVD).

BEST MODE FOR CARRYING OUT THE INVENTION

Figure 1:
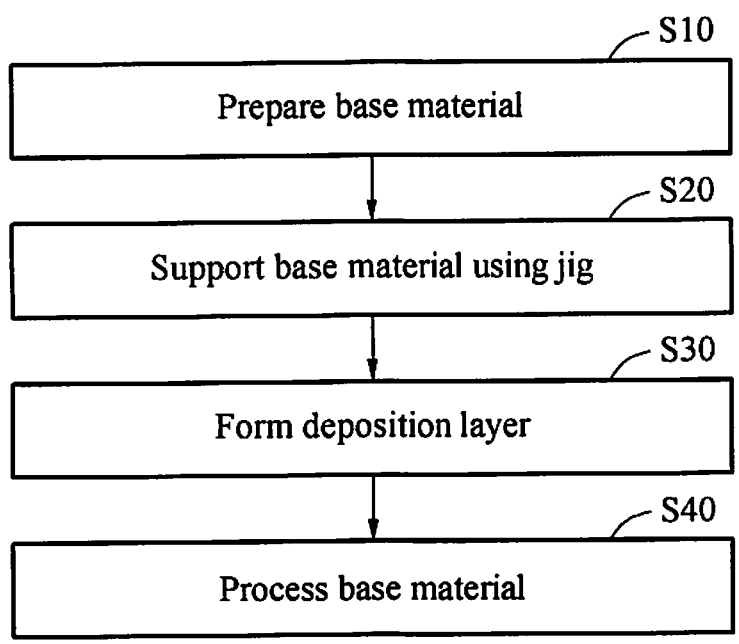
FIG. 1 is a flowchart illustrating a method of manufacturing a semiconductor manufacturing part using a jig according to an example embodiment.

Hereinafter, example embodiments will be described with reference to the accompanying drawings, wherein like reference numerals refer to the like elements throughout.

However, various changes, modifications, and equivalents of the methods, apparatuses, and/or systems described herein will be apparent after an understanding of the disclosure of this application. The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for the purpose of describing particular embodiments only and is not intended to be limiting the present disclosure. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, operations, elements, and/or components, but do not preclude the presence or addition of one or more other features, integers, operations, elements, components, and/or groups thereof.

Unless otherwise defined, all terms, including technical and scientific terms, used herein have the same meaning as commonly understood by one of ordinary skill in the art to which this disclosure pertains based on an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

Reference will now be made in detail to the example embodiments. Regarding the reference numerals assigned to the elements in the drawings, it should be noted that the same elements will be designated by the same reference numerals, wherever possible, even though they are shown in different drawings. Also, in the description of the example embodiments, detailed description of well-known related structures or functions will be omitted when it is deemed that such description will cause ambiguous interpretation of the present disclosure.

FIG. 1 is a flowchart illustrating a method of manufacturing a semiconductor manufacturing part using a jig according to an example embodiment.

Referring to FIG. 1, a method of manufacturing a semiconductor manufacturing part using a jig according to the present disclosure may include an operation (S10) of preparing a base material; an operation (S20) of supporting at least one surface of the base material using the jig; an operation (S30) of forming a deposition layer by injecting source gas into the base material supported by the jig; and an operation (S40) of processing the base material on which the deposition layer is formed. The jig has a cross-section in a tapered shape and of which a width increases with getting closer to the surface of the base material.

Figure 2:
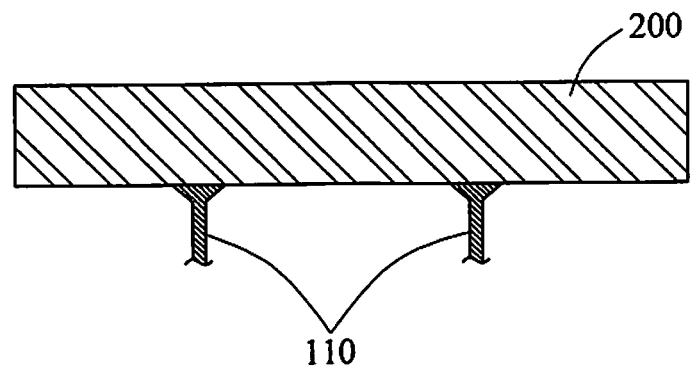
FIG. 2 is a cross-sectional view illustrating a structure in which a base material is supported using a jig in a tapered shape according to an example embodiment.

FIG. 2 is a cross-sectional view illustrating a structure in which a base material 200 is supported using a jig 110 in a tapered shape according to an example embodiment. The base material 200 of FIG. 2 is an example of a base material provided according to an aspect and may be a base material used to manufacture a focus ring available in a plasma etching device. According to an example embodiment, although it is not illustrated in FIG. 2, the base material of the semiconductor manufacturing part may include a stepped structure having a step based on specifications and characteristics of a semiconductor manufacturing apparatus to which the semiconductor manufacturing part applies. Here, a cross-section of the step may include a curved surface. Alternatively, an angle between surfaces of the step may be an obtuse angle.

According to an aspect, a deposition layer may be formed on the base material using source gas. Here, although a method of forming the deposition layer is not particularly limited to the example embodiments, the deposition layer may be formed by injecting source gas into the base material in an airtight chamber using a chemical vapor deposition (CVD) method. For example, the operation of forming the deposition layer may be performed at a temperature of 1000° C. to 1900° C.

Here, the deposition layer may be formed using a material having a physical property suitable for a semiconductor manufacturing process. For example, in the case of a part susceptible to be exposed to plasma in a dry etching device, source gas capable of forming a SiC or TaC deposition layer having an excellent plasma resistance may be injected to prevent etching.

In the semiconductor manufacturing part according to an aspect, the deposition layer may be uniformly formed over the entire surface of the base material in the confined space. For example, in the case of a focus ring, when plasma is applied to the focus ring, it may cause etching over the entire surface of the deposition layer. Therefore, there is a need to prevent the base material from being exposed to plasma by uniformly forming the deposition layer over the entire surface of the base material, which requires uniform deposition over the entire surface.

Here, a jig configured to support the base material in the chamber may be used. For the uniform deposition over the entire surface in the chamber, a minimum area of the base material may be supported by the jig to appear as if the base material is floating in the air. The jig described herein refers to any type of structures capable of safely fastening the base material in the chamber.

Here, most desirably, a contact point between the jig and the base material may be formed as a point. However, in this case, the base material may be unstably supported. Accordingly, a stable support structure may be secured by forming the contact point between the jig and the base material as a surface.

Here, deposition may be ununiformly performed around a contact surface between the jig and the base material based on a shape of the jig. In particular, the jig may occlude a deposition surface from source gas based on an angle between the jig and the base material or the shape of the jig. In this case, deposition-free space may be present around the contact surface between the jig and the base material. Alternatively, although the deposition is performed, a relatively small amount of deposition may be formed compared to other portions.

For example, in the case of depositing SiC on the base material of the focus ring, a SiC deposition layer may be formed with a relatively thin thickness on a portion adjacent to the jig or on an empty space based on the shape of the jig and the base material may be easily exposed due to plasma. When the base material is exposed to plasma, the base material may become arsenic acid in the chamber since the base material is generally relatively vulnerable to plasma, and may greatly contaminate inside of the chamber and degrade quality of a semiconductor product.

Therefore, according to an aspect, there is provided a method that may design a shape of the jig and thereby uniformly form a possibly homogeneous quality of the deposition layer over the entire surface when manufacturing a semiconductor manufacturing part, regardless of jig support.

Here, according to an aspect, the jig may have a cross-section in a tapered shape and of which a width increases with getting closer to the surface of the base material. Referring to FIG. 2, jigs 110 having the tapered cross-section support a bottom surface of the base station (focus ring). Here, the jig may be plural to form a stable support structure based on a size and a shape of the base material.

According to an example embodiment, in a contact portion between the jig and the base material, an angle between the jig and the base material of the contact portion may be an obtuse angle.

When the angle between the jig and the base material is an acute angle in the contact portion between the jig and the base material, the base material may be occluded by the jig. In this case, source gas may not be homogeneously deposited on the contact portion between the jig and the base material.

Figure 3:
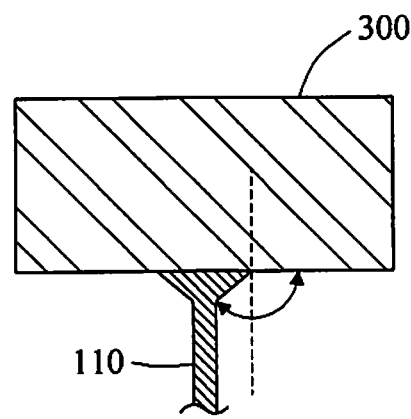
FIG. 3 is an enlarged cross-sectional view illustrating a portion of a structure in which a base material is supported using a jig in a tapered shape according to an example embodiment.

FIG. 3 is an enlarged cross-sectional view illustrating a portion of a structure in which a base material 300 is supported using a jig in a tapered shape according to an example embodiment.

Referring to FIG. 3, when an angle between the jig and the base material of a contact portion between the jig and the base material is an obtuse angle in the contact portion, the jig may not occlude the surface of the base material from source gas.

According to an example embodiment, the angle between the jig and the base material of the contact portion may be 95 degrees to 170 degrees. For example, the angle between the jig and the base material of the contact portion may be beyond 95 degrees. When the angle is less than 95 degrees, the deposition layer may not be homogeneously formed on the contact portion between the jig and the base material. Also, the angle between the jig and the base material of the contact portion may be less than 170 degrees.

According to an example embodiment, the jig may include at least one of graphite, carbon black, and SiC. Here, the jig may be covered using the deposition layer with the base material and subsequently processed therewith. Accordingly, a material on which source gas may be excellently deposited may be selected.

According to an example embodiment, the processing may include performing a cutting process to include the deposition layer configured to include at least a portion of the base material and to cover at least a portion of the jig.

Here, the processing may include smoothly processing at least a portion of the formed deposition layer. Also, the processing may include performing the cutting process on the base material on which the deposition layer is formed based on specification of a semiconductor manufacturing part. Here, the formed semiconductor manufacturing part may include at least a portion of the base material and also include the deposition layer in which at least a portion of the jig is covered.

That is, the deposition layer may be formed on the base material in a state in which the jig supports the base material. In the processing, the semiconductor manufacturing part may be formed including a contact portion between the jig and the base material. Here, a portion of the jig may be included in the finally formed semiconductor manufacturing part.

According to an example embodiment, the base material may include at least one of graphite, TaC, reaction sintered SiC, pressureless sintered SiC, hot press SiC, recrystallized SiC, and CVD SiC. Components of the base material may be components that are not easily separable from the SiC deposition layer. Any material easily inseparable from the SiC layer formed on the base material may be further included as an additional component. Any material that enables the deposition layer to be homogenously formed on the base material without separation may be used for the base material.

According to an example embodiment, a thickness ratio of the base material to the deposition layer may be 1:1 to 100:1.

Here, the deposition may be performed by including the base material. According to an example embodiment, in the case of forming the semiconductor manufacturing part with a relatively thick thickness while including the deposition layer, the deposition layer may be formed with a relatively thin thickness while the base material may be formed with a relatively thick thickness. A material requiring a relatively high physical property may be used for the deposition layer. In this case, cost of the material used for the deposition layer may be relatively high compared to that of the base material. Therefore, the thickness ratio of the base material to the deposition layer may be 1:1 to 100:1. When a ratio of the base material over the thickness of the deposition layer is less than 1, the thickness of the deposition layer may increase, which may lead to increasing production cost. Also, when the ratio exceeds 100, the thickness of the deposition layer may decrease relatively significantly, which may cause the base material to be exposed to plasma.

Here, the thickness of the SiC deposition layer corresponds to a sum of vertical lengths of thicknesses deposited on and below the base material. Here, the thickness of the base material denotes a vertical length at any position although the base material is not in a rectangular block form but in a stepped structure.

A method of manufacturing a semiconductor manufacturing part using a jig according to the present disclosure may include preparing a base material; supporting at least one surface of the base material using the jig; forming a deposition layer by injecting source gas into the base material supported by the jig; and processing the base material on which the deposition layer is formed. Here, at least one side of a cross-section of the jig that connects to a contact surface with the base material is rounded.

Figure 4:
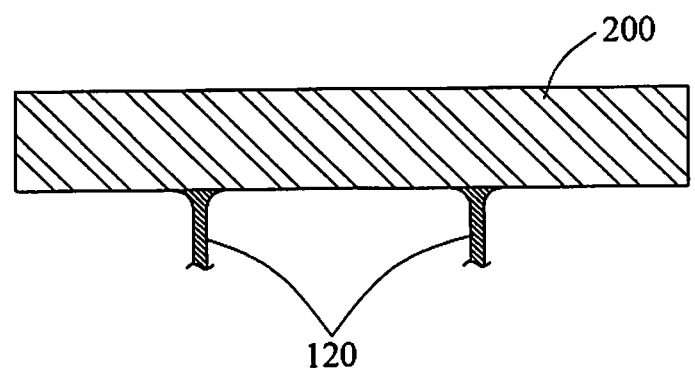
FIG. 4 is a cross-sectional view illustrating a structure in which a base material is supported using a jig of which at least one side of a cross-section that connects to a contact surface with the base material is rounded according to another example embodiment.

FIG. 4 is a cross-sectional view illustrating a structure in which a base material is supported using a jig 120 of which at least one side of a cross-section that connects to a contact surface with the base material is rounded according to another example embodiment.

With the same purpose as that of the aforementioned tapered jig, at least one side of a cross-section of the jig provided according to an aspect may be in a rounded shape. Here, the rounded shape may be formed along a virtual spherical surface having the center of sphere at an outside of the jig. The cross-section of the jig formed as above is illustrated in FIG. 4. Also, the rounded shape is provided as an example only and any structure that enables the deposition layer to be uniformly formed between the jig and the base material may be applied. For example, the rounded shape may be formed by connecting various curved surfaces.

An apparatus for manufacturing a semiconductor manufacturing part using a jig according to the present disclosure may include a chamber; a source gas injecting nozzle provided inward at an outside of the chamber; a mounting portion configured to extend from at least one side of the chamber toward an inner center of the chamber; and a replaceable jig configured to support a base material that is connected at one end of the mounting portion. Here, the jig may have a cross-section in a tapered shape and of which a width increases with getting closer to the surface of the base material.

According to another aspect, there is provided an apparatus for manufacturing a semiconductor manufacturing part. The manufacturing apparatus may include a mounting portion and a jig connected at one end of the mounting portion. The jig may be replaceable when deposition of a coated material is completed once. Here, while maintaining the mounting portion, the jig formed at one end of the mounting portion may be separated and replaced. Also, the mounting portion and the jig may be replaced together. Although it is described that the jig and the mounting portion are separately formed, the jig and the mounting portion may be integrally formed. Also, the mounting portion may be in a structure in which an opposite end of the jig may be fastened to at least one side of the chamber. The manufacturing apparatus may be a CVD apparatus.

As described above, the jig may have a cross-section in a tapered shape to form the homogenous deposition layer in the contact portion between the jig and the base material. Also, an angle between the jig and the base material of the contact portion may be an obtuse angle in the contact portion between the jig and the base material. Also, the angle between the jig and the base material of the contact portion may be 95 degrees to 170 degrees.

An apparatus for manufacturing a semiconductor manufacturing part using a jig according to the present disclosure may include a chamber; a source gas injecting nozzle provided inward at an outside of the chamber; a mounting portion configured to extend from at least one side of the chamber toward an inner center of the chamber; and a replaceable jig configured to support a base material that is connected at one end of the mounting portion. At least one side of a cross-section of the jig may be concavely rounded.

Here, the rounded shape may be formed along a virtual spherical surface having the center of sphere at an outside of the jig. Also, any structure that enables the deposition layer to be uniformly formed between the jig and the base material with which the jig is in contact may be applied for the rounded shape. For example, the rounded shape may be formed by connecting various curved surfaces.

A jig for manufacturing a semiconductor manufacturing part according to the present disclosure may support a base material and may have a cross-section in a tapered shape and of which a width increases with getting closer to the surface of the base material.

Also, a jig for manufacturing a semiconductor manufacturing part according to the present disclosure may support a base material, and at least one side of a cross-section of the jig that connects to a contact surface with the base material may be rounded.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

The invention claimed is:

1. A method of manufacturing a semiconductor manufacturing part using a jig, the method comprising:
 preparing a base material;
 supporting at least one surface of the base material using the jig;
 forming a deposition layer by injecting source gas into the base material supported by the jig; and processing the base material on which the deposition layer is formed, wherein the jig has a cross-section in a tapered shape and of which a width increases with getting closer to the surface of the base material, and the processing comprises performing a cutting process to include at least a portion of the base material and to include the deposition layer configured to cover at least a portion of the jig.

2. The method of claim 1, wherein, in a contact portion between the jig and the base material, an angle between the jig and the base material of the contact portion is an obtuse angle.

3. The method of claim 2, wherein the angle between the jig and the base material of the contact portion is 95 degrees to 170 degrees.

4. The method of claim 1, wherein the jig comprises at least one selected from a group consisting of graphite, carbon black, and SiC.

5. The method of claim 1, wherein the base material comprises at least one selected from a group consisting of graphite, TaC, reaction sintered SiC, pressureless sintered SiC, hot press SiC, recrystallized SiC, and CVD SiC.

6. The method of claim 1, wherein a thickness ratio of the base material to the deposition layer is 1:1 to 100:1.

7. A method of manufacturing a semiconductor manufacturing part using a jig, the method comprising:

preparing a base material;

supporting at least one surface of the base material using the jig;

forming a deposition layer by injecting source gas into the base material supported by the jig; and processing the base material on which the deposition layer is formed, wherein at least one side of a cross-section of the jig that connects to a contact surface with the base material is rounded, and the processing comprises performing a cutting process to include at least a portion of the base material and to include the deposition layer configured to cover at least a portion of the jig.

\* \* \* \* \*